(12) United States Patent
Bergman et al.

(10) Patent No.: US 10,757,800 B1
(45) Date of Patent: Aug. 25, 2020

(54) STRIPLINE TRANSMISSION LINES WITH CROSS-HATCHED PATTERN RETURN PLANE, WHERE THE STRIPLINES DO NOT OVERLAP ANY INTERSECTIONS IN THE CROSS-HATCHED PATTERN

(71) Applicant: Flex Ltd., Singapore (SG)

(72) Inventors: Mark Bergman, Redwood City, CA (US); Franz Gisin, San Jose, CA (US)

(73) Assignee: Flex Ltd., Singapore (SG)

( * ) Notice: Subject to any disclaimer, the term of this patent is extended or adjusted under 35 U.S.C. 154(b) by 75 days.

(21) Appl. No.: 16/016,138

(22) Filed: Jun. 22, 2018

Related U.S. Application Data

(60) Provisional application No. 62/523,643, filed on Jun. 22, 2017.

(51) Int. Cl.
H05K 1/02 (2006.01)
H01P 3/08 (2006.01)
H01P 3/02 (2006.01)
H01P 3/04 (2006.01)

(52) U.S. Cl.
CPC .......... *H05K 1/0225* (2013.01); *H01P 3/026* (2013.01); *H01P 3/04* (2013.01); *H01P 3/08* (2013.01); *H01P 3/082* (2013.01); *H05K 1/028* (2013.01); *H05K 1/0228* (2013.01); *H05K 1/0245* (2013.01); *H05K 2201/09236* (2013.01); *H05K 2201/09245* (2013.01); *H05K 2201/09272* (2013.01)

(58) Field of Classification Search
CPC . H01P 3/026; H01P 3/04; H01P 3/082; H05K 1/0225; H05K 1/0245

USPC .................................................. 333/4, 238, 5
See application file for complete search history.

(56) References Cited

U.S. PATENT DOCUMENTS

| 3,671,726 A | | 6/1972 | Kerr | |
|---|---|---|---|---|
| 4,855,537 A | * | 8/1989 | Nakai et al. | H05K 1/0253 174/250 |
| 5,479,138 A | * | 12/1995 | Kuroda et al. | H01P 3/088 333/1 |
| 5,675,299 A | * | 10/1997 | Suski | H01P 3/088 333/1 |

(Continued)

FOREIGN PATENT DOCUMENTS

| CN | 108020164 A | 10/2016 |
|---|---|---|
| KR | 20090090701 A | 7/2009 |

OTHER PUBLICATIONS

Non-Final Office Action dated Sep. 19, 2019, U.S. Appl. No. 15/995,965, filed Jun. 1, 2018, Applicant: Weifeng Liu, 20 pages.

(Continued)

*Primary Examiner* — Benny T Lee
(74) *Attorney, Agent, or Firm* — Haverstock & Owens LLP

(57) ABSTRACT

A circuit board transmission line structures has microstrip or stripline transmission line geometries and cross-hatch patterned return planes. The cross-hatch design structure of the return planes and the relative position of the cross-hatch pattern to the transmission lines are configured to increase the usable bandwidth of the transmission lines. By properly adjusting the size and shape of the cross-hatch pattern, the performance of the microstrip and stripline transmission lines can be largely restored to the performance where continuous, solid return planes are used.

30 Claims, 11 Drawing Sheets

(56) References Cited

U.S. PATENT DOCUMENTS

| | | | |
|---|---|---|---|
| 6,035,524 A | 3/2000 | Suppa | |
| 7,072,721 B1 | 7/2006 | Trent | |
| 7,504,904 B1 * | 3/2009 | Powers et al. | H01P 3/081 333/1 |
| 7,578,195 B2 | 8/2009 | DeAngelis | |
| 7,687,899 B1 | 3/2010 | Berry | |
| 7,872,343 B1 | 1/2011 | Berry | |
| 8,283,767 B1 | 10/2012 | Berry | |
| 8,409,917 B2 | 4/2013 | Yoon | |
| 8,587,385 B2 * | 11/2013 | Umeda | H05K 1/0245 333/33 |
| 8,941,225 B2 | 1/2015 | Choi | |
| 10,121,722 B1 | 11/2018 | Jha | |
| 10,186,480 B2 | 1/2019 | Muthukumar | |
| 2001/0055069 A1 | 12/2001 | Hudson | |
| 2005/0231105 A1 | 10/2005 | Lovell | |
| 2006/0135863 A1 | 6/2006 | Birnbaum | |
| 2007/0215883 A1 | 9/2007 | Dixon | |
| 2008/0282540 A1 | 11/2008 | Singleton | |
| 2009/0140415 A1 | 6/2009 | Furuta | |
| 2009/0243072 A1 | 10/2009 | Ha | |
| 2010/0037497 A1 | 2/2010 | Anelevitz | |
| 2010/0148356 A1 | 6/2010 | Tamaki | |
| 2011/0031598 A1 | 2/2011 | Lee | |
| 2012/0119404 A1 | 5/2012 | Wallace | |
| 2012/0165633 A1 | 6/2012 | Khair | |
| 2012/0238910 A1 | 9/2012 | Nordstrom | |
| 2014/0117843 A1 | 5/2014 | Huffer | |
| 2014/0312481 A1 | 10/2014 | Choi | |
| 2015/0001731 A1 | 1/2015 | Shuto | |
| 2015/0084170 A1 | 3/2015 | Im | |
| 2015/0257278 A1 | 9/2015 | Niskala | |
| 2015/0366504 A1 | 12/2015 | Connor | |
| 2016/0270727 A1 | 9/2016 | Berg | |
| 2017/0099729 A1 * | 4/2017 | Kim et al. | H01P 3/081 |
| 2017/0141080 A1 | 5/2017 | Chen | |
| 2017/0170799 A1 * | 6/2017 | Kong et al. | G06F 13/382 |
| 2017/0172421 A1 | 6/2017 | Dabby | |
| 2017/0250170 A1 | 8/2017 | Yu | |
| 2017/0365644 A1 | 12/2017 | Zheng | |
| 2018/0090471 A1 | 3/2018 | Chiu | |
| 2018/0249767 A1 | 9/2018 | Begriche | |
| 2018/0315740 A1 | 11/2018 | Im | |
| 2018/0366412 A1 | 12/2018 | Hsieh | |
| 2019/0019758 A1 | 1/2019 | Kim | |
| 2019/0029136 A1 | 1/2019 | Bharadwaj | |
| 2019/0051615 A1 | 2/2019 | Nair | |
| 2019/0067207 A1 | 2/2019 | Hu | |
| 2019/0067258 A1 | 2/2019 | Kim | |
| 2019/0103364 A1 | 4/2019 | Kim | |
| 2019/0181097 A1 | 6/2019 | Cheah | |
| 2019/0229046 A1 | 7/2019 | Tsai | |
| 2019/0295937 A1 | 9/2019 | Zhang | |
| 2019/0378795 A1 | 12/2019 | Lee | |
| 2019/0385977 A1 | 12/2019 | Elsherbini | |
| 2020/0105719 A1 | 4/2020 | Li | |

OTHER PUBLICATIONS

Non-Final Office Action dated Feb. 4, 2020, U.S. Appl. N. 16/221,256, filed Dec. 14, 2018, Applicant: Cheng Yang, 18 pages.

Non-Final Office Action, dated May 20, 2020, U.S. Appl. No. 16/221,256, filed Dec. 14, 2018, applicant Cheng-Yang, 18 pages.

* cited by examiner

US 10,757,800 B1

STRIPLINE TRANSMISSION LINES WITH CROSS-HATCHED PATTERN RETURN PLANE, WHERE THE STRIPLINES DO NOT OVERLAP ANY INTERSECTIONS IN THE CROSS-HATCHED PATTERN

RELATED APPLICATIONS

This Patent Application claims priority under 35 U.S.C. 119(e) of the U.S. provisional patent application, Application No. 62/523,643, filed on Jun. 22, 2017, and entitled "METHODS TO INCREASE THE PERFORMANCE OF RIGID AND FLEXIBLE PCB MICROSTRIP AND STRIPLINE TRANSMISSION LINES USING CROSS-HATCHED RETURN PLANES," which is hereby incorporated by reference in its entirety.

FIELD OF THE INVENTION

The present invention is generally directed to circuit boards having transmission line geometries. More specifically, the present invention is directed to rigid and flexible circuit board microstrip and stripline transmission lines using cross-hatched return planes.

BACKGROUND OF THE INVENTION

A circuit board mechanically supports and electrically connects electronic components using conductive traces, pads and other features etched from electrically conductive sheets, such as copper sheets, laminated onto a non-conductive substrate. Multi-layered circuit boards are formed by stacking and laminating multiple such etched conductive sheets and non-conductive substrates. In some applications, high performance rigid and flexible circuit board-based interconnects are constructed using geometries that form one or more transmission lines within the circuit board. The transmission lines are formed from a patterned conductive layer positioned within the circuit board stack-up. A geometry consisting of a single transmission line is referred to as a single ended geometry. A geometry consisting of two transmission lines is referred to as a differential pair geometry. In order for the transmission lines to meet specific impedance characteristics, the circuit board stack up also includes one or more return planes, one return plane stacked above and/or another return plane stacked below the transmission lines. A transmission line geometry refers to a specific combination of the one or more transmission lines and the one or more return planes. Two types of transmission line geometries that are commonly used in rigid and flexible circuit boards are the stripline and microstrip geometries. The stripline geometry refers to the transmission line geometry having two return planes. The stripline geometry can be combined with either a single transmission line, collectively referred to as a single ended stripline geometry, or two transmission lines, collectively referred to as a differential pair stripline geometry. The microstrip geometry refers to a transmission line geometry having a single return plane. The microstrip geometry can be combined with either a single transmission line, collectively referred to as a single ended microstrip geometry, or two transmission lines, collectively referred to as a differential pair microstrip geometry. In either the microstrip or stripline geometries, the return planes are constructed out of continuous, solid planes of conductive material.

FIG. 1 illustrates a conventional circuit board 14 having a differential pair stripline geometry. The left hand side shows a cut out side view of the circuit board 14 as a laminated stack. The right hand side shows a perspective exploded view of the circuit board 14. The circuit board 14 includes an upper return plane 2, one or more isolation layers 10, two signal traces 6 and 8, one or more isolation layers 12, and a lower return plane 4. The two signal traces 6 and 8 form the differential pair transmission lines. The one or more isolation layers 10 and the one or more isolation layers 12 can be made of different non-conducting dielectric materials and thicknesses, which prevent the signal traces 6 and 8 from electrically shorting to the return planes 2 and 4. The upper return plane 2 and the lower return plane 4 each form continuous, solid planes. The return planes can be made of one or more conductive materials, including, but not limited to, copper, nickel, gold, and tin, or a mixture of conductive and non-conductive materials, such as conductive ink.

FIG. 2 illustrates a conventional circuit board 16 having a single ended stripline geometry. The left hand side shows a cut out side view of the circuit board 16 as a laminated stack. The right hand side shows a perspective exploded view of the circuit board 16. The circuit board 16 having the single ended stripline geometry is structurally similar to the circuit board 14 having the differential pair stripline geometry of FIG. 1 except the circuit board 16 has only a single trace 6 instead of two traces.

FIG. 3 illustrates a conventional circuit board 18 having a differential pair microstrip geometry. The left hand side shows a cut out side view of the circuit board 18 as a laminated stack. The right hand side shows a perspective exploded view of the circuit board 18. The circuit board 18 having the differential pair microstrip geometry is structurally similar to the circuit board 14 having the differential pair stripline geometry of FIG. 1 except the circuit board 18 has only a single return plane 4 instead of two return planes. The one or more isolation layers 10 are optional in the case of the circuit board 18, whereas the one or more isolation layers 10 are mandatory in the case of the circuit board 14 of FIG. 1.

FIG. 4 illustrates a conventional circuit board 20 having a single ended microstrip geometry. The left hand side shows a cut out side view of the circuit board 20 as a laminated stack. The right hand side shows a perspective exploded view of the circuit board 20. The circuit board 20 having the single ended microstrip geometry is structurally similar to the circuit board 16 having the single ended stripline geometry of FIG. 2 except the circuit board 20 has only a single return plane 4 instead of two return planes. The one or more isolation layers 10 are optional in the case of the circuit board 20, whereas the one or more isolation layers 10 are mandatory in the case of the circuit board 16 of FIG. 2.

In some applications, a circuit board having transmission line(s) requires a high degree of flexibility. However, return plane(s) that are continuous, solid planes are too rigid to meet many such flexibility requirements. In such applications, each continuous, solid return plane can be replaced with a cross-hatched return plane. Cross-hatching involves removing a portion of the conductive material in the return plane so that the return plane is no longer a continuously solid plane. A circuit board having cross-hatched return plane(s) has a much greater degree of flexing, twisting, bending, and the like than a circuit board having continuous, solid return plane(s). The cross-hatched return plane has a cross-hatch width W equal to a cross-hatch height H, as shown in FIG. 5, and the cross-hatch pattern is randomly placed relative to the transmission lines. Although the cross-hatched return plane(s) enables a circuit board to have a greater degree of flexibility, cross-hatching degrades the electrical performance of the microstrip and stripline transmission line(s).

SUMMARY OF THE INVENTION

Embodiments are directed to circuit board transmission line structures having microstrip or stripline transmission line geometries and cross-hatch patterned return planes. The cross-hatch design structure of the return planes and the relative position of the cross-hatch pattern to the transmission lines are configured to increase the usable bandwidth of the transmission lines. By properly adjusting the size and shape of the cross-hatch pattern, the performance of the microstrip and stripline transmission lines can be largely restored to the performance where continuous, solid return planes are used.

In an aspect, a circuit board transmission line structure is disclosed which includes a stack of one or more insulating layers, a transmission line stacked on a first surface of the stack of one or more insulating layers, and a cross-hatch patterned return plane stacked on a second surface of the stack of one or more insulating layers. The cross-hatch patterned return plane includes a plurality of cross-hatch intersections, and the cross-hatch patterned return plane and the transmission line are aligned such that the transmission line is vertically aligned between the plurality of cross-hatch intersections without overlapping any of the plurality of cross-hatch intersections. In some embodiments, the cross-hatch intersections are arranged in rows. In some embodiments, the cross-hatch intersections of each row are offset relative to the cross-hatch intersections of each adjacent row. In some embodiments, the transmission line is vertically positioned between the cross-hatch intersections of a first row and the cross-hatch intersections of a second row adjacent to the first row. In some embodiments, the transmission line is centered between the cross-hatch intersections of the first row and the cross-hatch intersections of the second row. In some embodiments, the circuit board transmission line structure also includes one or more additional insulating layers and a second cross-hatch patterned return plane, wherein the one or more additional insulating layers are stacked on the transmission line such that the transmission line is stacked between the one or more insulating layers and the one or more additional insulating layers, further wherein the second cross-hatch patterned return plane is stacked on a surface of the one or more additional insulating layers such that the transmission line is positioned between the cross-hatch patterned return plane and the second cross-hatch patterned return plane. In some embodiments, the second cross-hatch patterned return plane includes a plurality of second cross-hatch intersections, and the second cross-hatch patterned return plane and the transmission line are aligned such that the transmission line is vertically aligned between the plurality of second cross-hatch intersections without overlapping any of the plurality of second cross-hatch intersections. In some embodiments, the cross-hatch patterned return plane and the second cross-hatch patterned return plane each have a same cross-hatch pattern, and the cross-hatch patterned return plane and the second cross-hatch patterned return plane are aligned such that the cross-hatch patterns of each completely overlap. In some embodiments, the transmission line, the cross-hatch patterned return plane, and the second cross-hatch patterned return plane form a single ended stripline geometry. In some embodiments, each cross-hatch in the cross-hatch patterned return plane includes a cross-hatch width and a cross-hatch height, further wherein the cross-hatch width is greater than the cross-hatch height. In some embodiments, the cross-hatch patterned return plane is aligned with the transmission line such that the cross-hatch width is parallel to the transmission line. In some embodiments, the transmission line and the cross-hatch patterned return plane form a single ended microstrip geometry. In some embodiments, the circuit board transmission line structure also includes a second transmission line stacked on the first surface of the stack of one or more insulating layers, wherein the cross-hatch patterned return plane and the second transmission line are aligned such that the second transmission line is vertically aligned between the plurality of cross-hatch intersections without overlapping any of the plurality of cross-hatch intersections. In some embodiments, the cross-hatch intersections are arranged in rows, and the transmission line is vertically positioned between the cross-hatch intersections of a first row and the cross-hatch intersections of a second row adjacent to the first row, and the second transmission line is vertically positioned between the cross-hatch intersections of a third row and the cross-hatch intersections of a fourth row adjacent to the third row, wherein the first transmission line is spaced apart from the second transmission line by at least two adjacent rows of cross-hatch interconnects in the cross-hatch patterned return plane. In some embodiments, the first transmission line is centered between the cross-hatch intersections of the first row and the cross-hatch intersections of the second row, and the second transmission line is centered between the cross-hatch intersections of the third row and the cross-hatch intersections of the fourth row.

In another aspect, another circuit board transmission line structure is disclosed. The circuit board transmission line structure includes a stack of one or more insulating layers, a pair of transmission lines forming a differential pair, the transmission lines stacked on a first surface of the stack of one or more insulating layers, and a cross-hatch patterned return plane stacked on a second surface of the stack of one or more insulating layers. The cross-hatch patterned return plane includes a plurality of cross-hatch intersections, and the cross-hatch patterned return plane and the transmission lines are aligned such that the transmission lines are each vertically aligned between the plurality of cross-hatch intersections without overlapping any of the plurality of cross-hatch intersections. In some embodiments, the cross-hatch intersections are arranged in rows. In some embodiments, the cross-hatch intersections of each row are offset relative to the cross-hatch intersections of each adjacent row. In some embodiments, a first transmission line of the differential pair is vertically positioned between the cross-hatch intersections of a first row and the cross-hatch intersections of a second row adjacent to the first row, and a second transmission line of the differential pair is vertically positioned between the cross-hatch intersections of the second row and the cross-hatch intersections of a third row adjacent to the second row. In some embodiments, the first transmission line is centered between the cross-hatch intersections of the first row and the cross-hatch intersections of the second row, and the second transmission line is centered between the cross-hatch intersections of the second row and the cross-hatch intersections of the third row. In some embodiments, the circuit board transmission line structure also includes one or more additional insulating layers and a second cross-hatch patterned return plane, wherein the one or more additional insulating layers are stacked on the transmission lines such that the transmission lines are stacked between the one or more insulating layers and the one or more additional insulating layers, further wherein the second cross-hatch patterned return plane is stacked on a surface of the one or more additional insulating layers such that the transmission lines are positioned between the cross-hatch patterned return plane and the second cross-hatch patterned return plane. In some embodiments, the second cross-hatch patterned return plane includes a plurality of second cross-hatch intersections, and the second cross-hatch patterned return plane and the transmission lines are aligned such that the transmission lines are vertically aligned between the plurality of second cross-hatch intersections without overlapping any of the plurality of second cross-hatch intersections. In some embodiments, the cross-hatch patterned return plane and the second cross-hatch patterned return plane each have a same cross-hatch pattern, and the cross-hatch patterned return plane and the second cross-hatch patterned return plane are aligned such that the cross-hatch patterns of each completely overlap. In some embodiments, the transmission lines, the cross-hatch patterned return plane, and the second cross-hatch patterned return plane form a differential pair stripline geometry. In some embodiments, each cross-hatch in the cross-hatch patterned return plane includes a cross-hatch width and a cross-hatch height, further wherein the cross-hatch width is greater than the cross-hatch height. In some embodiments, the cross-hatch patterned return plane is aligned with the transmission lines such that the cross-hatch width is parallel to the transmission lines. In some embodiments, the transmission lines and the cross-hatch patterned return plane form a differential pair microstrip geometry. In some embodiments, the circuit board transmission line structure also includes a second pair of transmission lines stacked on the first surface of the stack of one or more insulating layers, wherein the cross-hatch patterned return plane and the second pair of transmission lines are aligned such that the second pair of transmission lines are each vertically aligned between the plurality of cross-hatch intersections without overlapping any of the plurality of cross-hatch intersections. In some embodiments, the cross-hatch intersections are arranged in rows, and a first transmission line of the first pair of transmission lines is vertically positioned between the cross-hatch intersections of a first row and the cross-hatch intersections of a second row adjacent to the first row, a second transmission line of the first pair of transmission lines is vertically positioned between the cross-hatch intersections of the second row and the cross-hatch intersections of a third row adjacent to the second row, a first transmission line of the second pair of transmission lines is vertically positioned between the cross-hatch intersections of a fourth row and the cross-hatch intersections of a fifth row adjacent to the fourth row, a second transmission line of the second pair of transmission lines is vertically positioned between the cross-hatch intersections of the fifth row and the cross-hatch intersections of a sixth row adjacent to the fifth row, wherein the second transmission line of the first pair of transmission lines is spaced apart from the first transmission line of the second pair of transmission lines by at least three adjacent rows of cross-hatch interconnects in the cross-hatch patterned return plane. In some embodiments, the first transmission line of the first pair of transmission lines is centered between the cross-hatch intersections of the first row and the cross-hatch intersections of the second row, the second transmission line of the first pair of transmission lines is centered between the cross-hatch intersections of the second row and the cross-hatch intersections of the third row, the first transmission line of the second pair of transmission lines is centered between the cross-hatch intersections of the fourth row and the cross-hatch intersections of the fifth row, and the second transmission line of the second pair of transmission lines is centered between the cross-hatch intersections of the fifth row and the cross-hatch intersections of the sixth row.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to circuit board transmission line structures. Those of ordinary skill in the art will realize that the following detailed description of the circuit board transmission line structures is illustrative only and is not intended to be in any way limiting. Other embodiments of the circuit board transmission line structures will readily suggest themselves to such skilled persons having the benefit of this disclosure.

Reference will now be made in detail to implementations of the circuit board transmission line structures as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
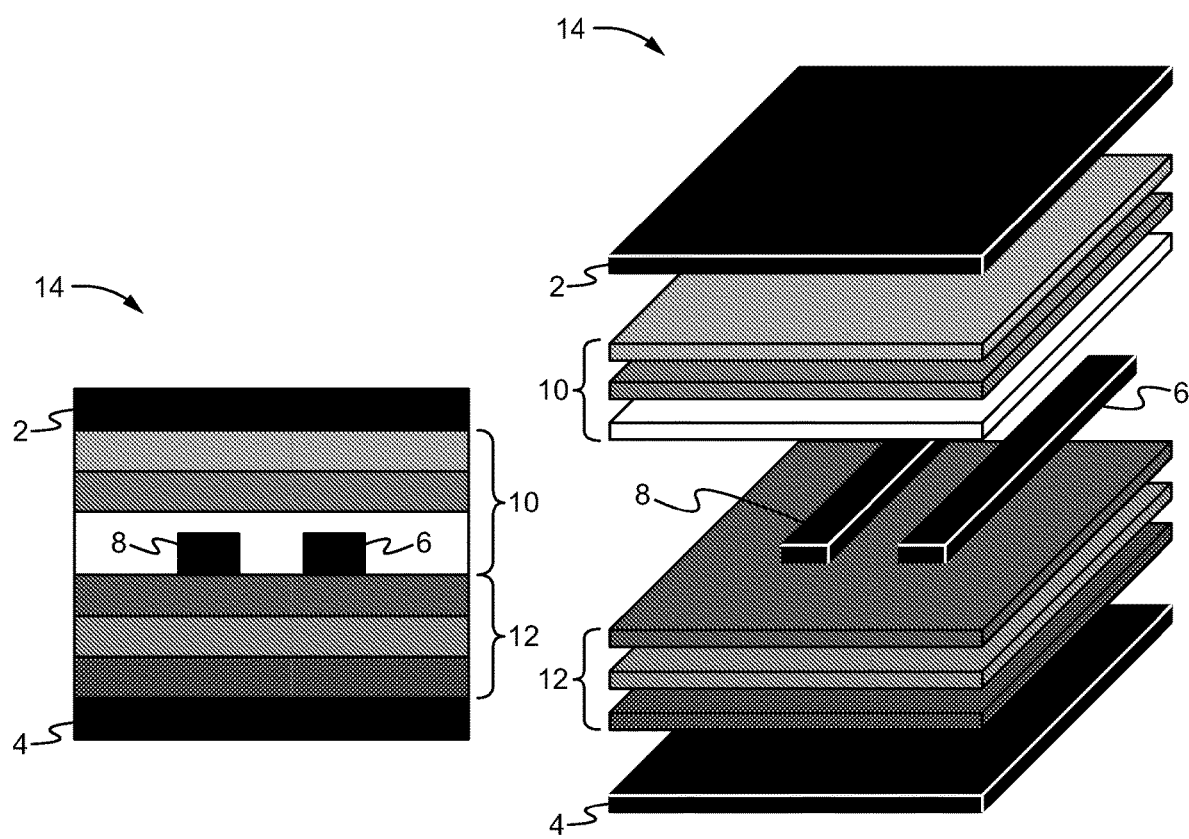
FIG. 1 illustrates a conventional circuit board having a differential pair stripline geometry.
Figure 2:
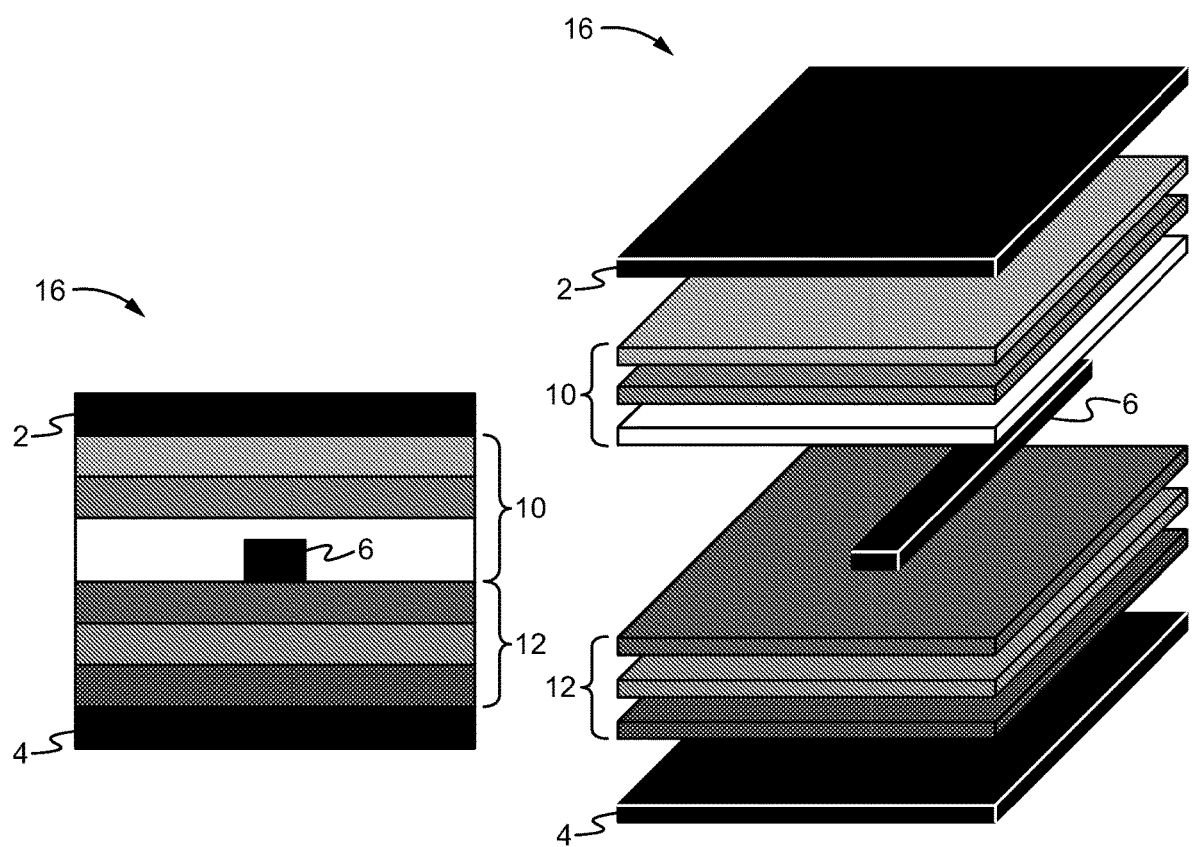
FIG. 2 illustrates a conventional circuit board having a single ended stripline geometry.
Figure 3:
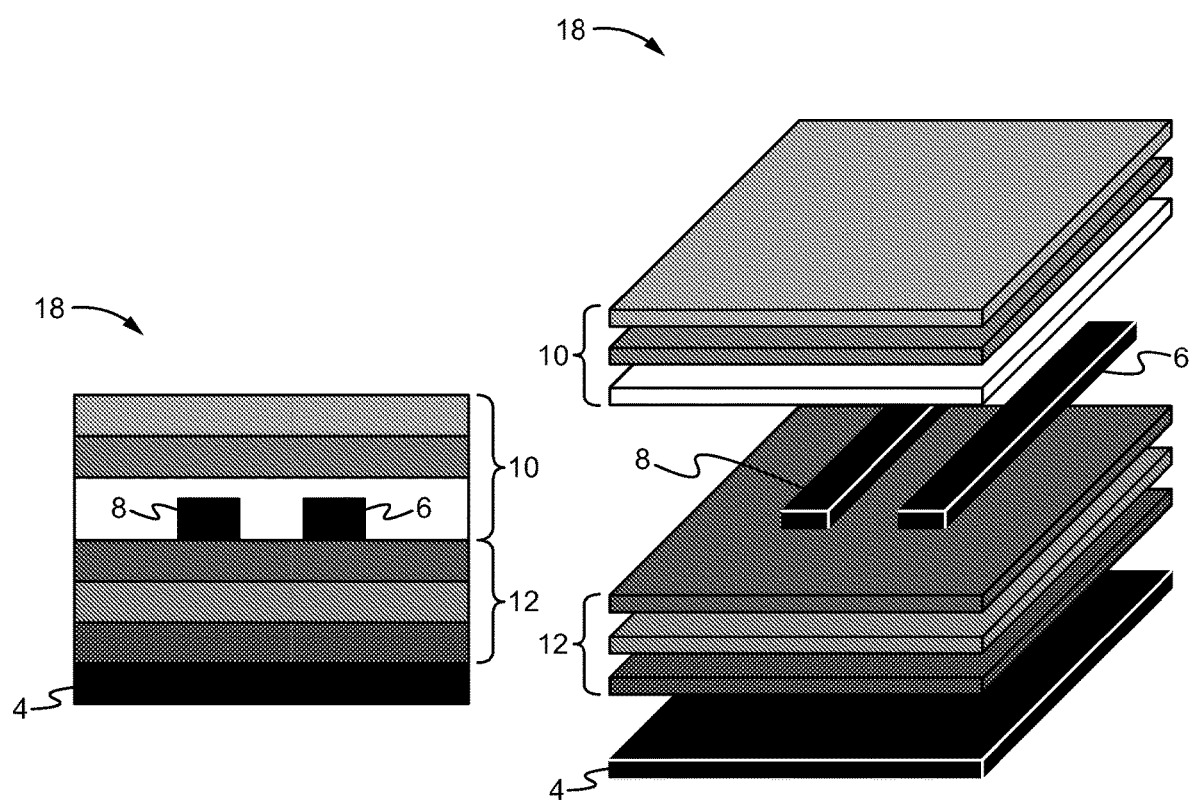
FIG. 3 illustrates a conventional circuit board having a differential pair microstrip geometry.
Figure 4:
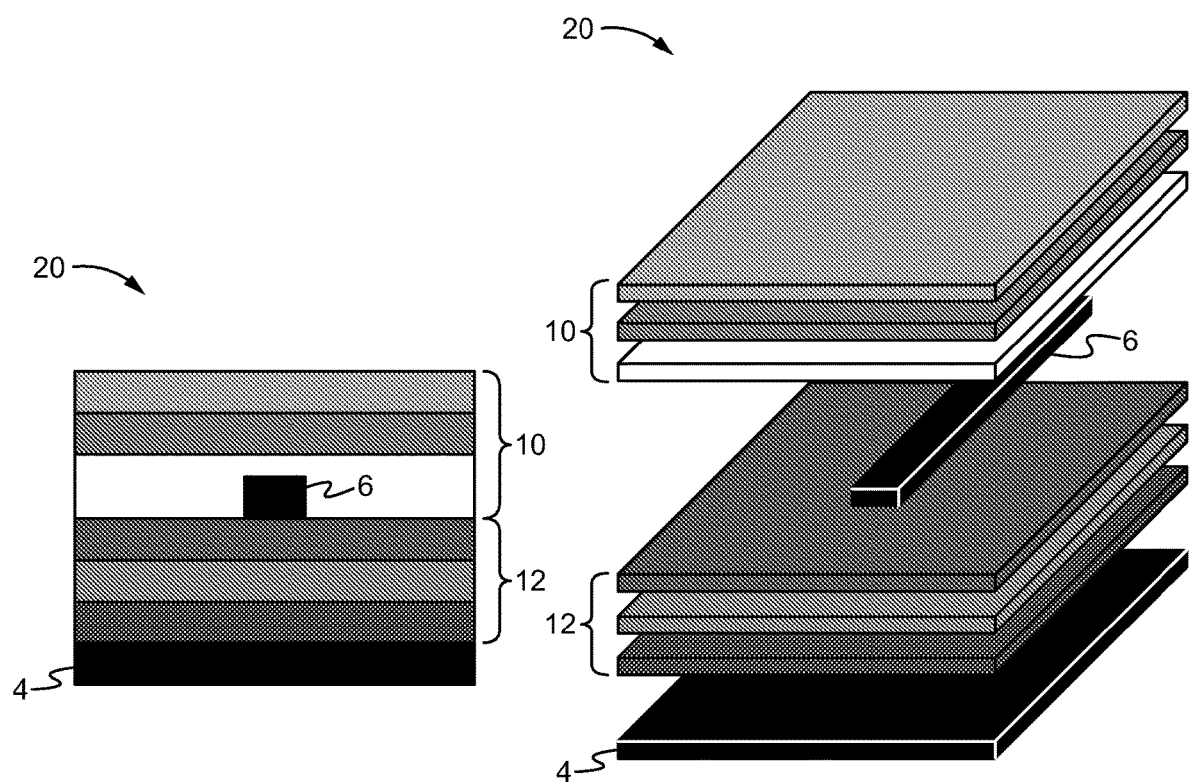
FIG. 4 illustrates a conventional circuit board having a single ended microstrip geometry.
Figure 5:
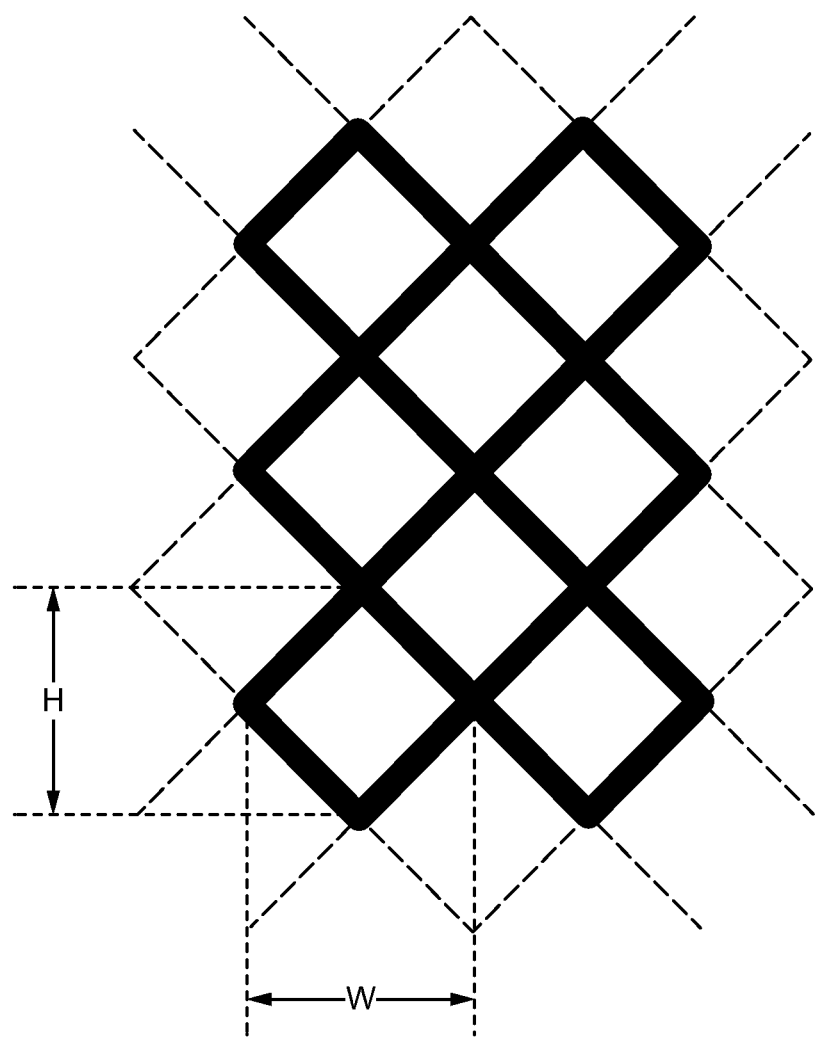
FIG. 5 illustrates a top down view of a conventional cross-hatched return plane.
Figure 6:
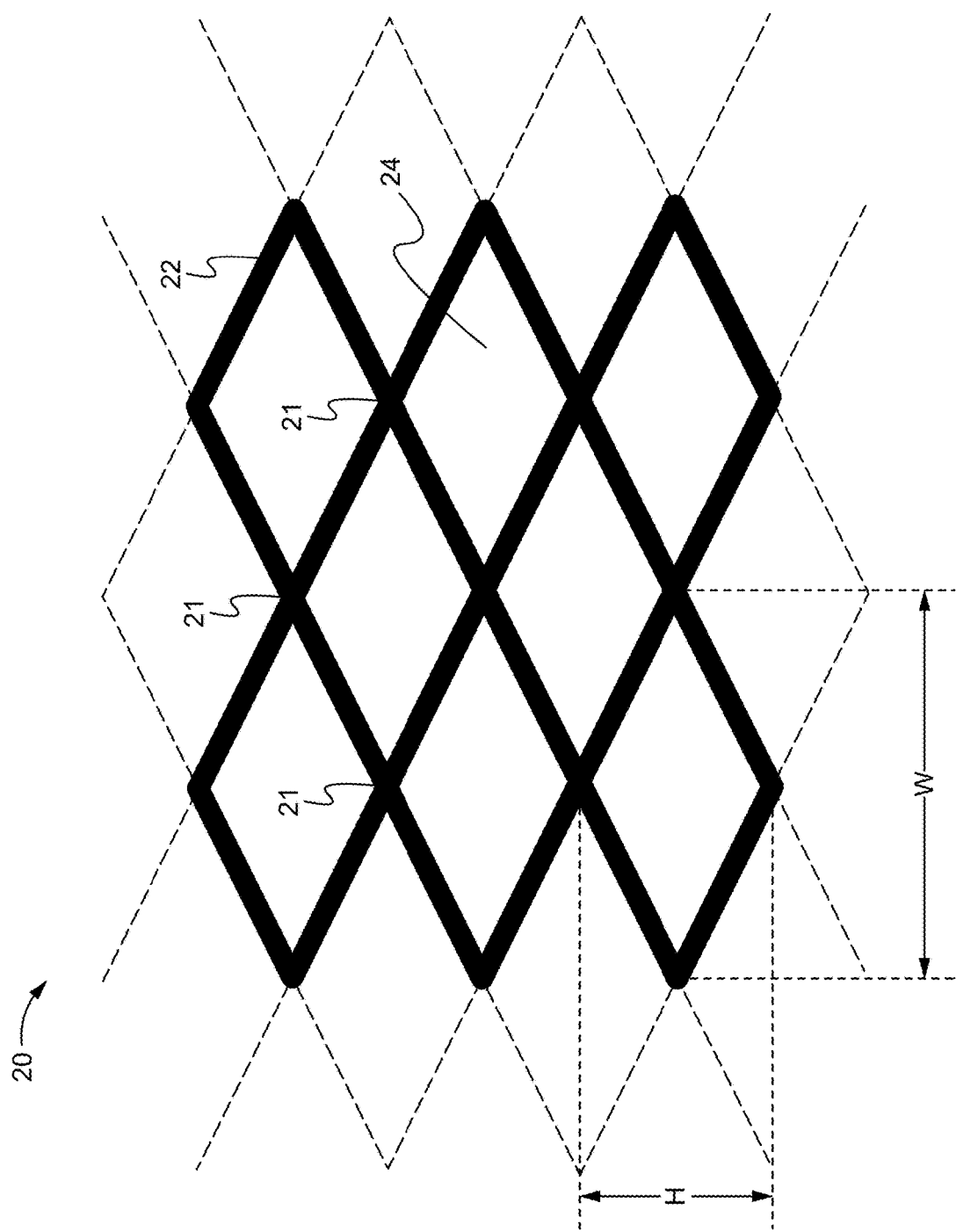
FIG. 6 illustrates a top down view of a cross-hatch patterned return plane used in the circuit board transmission line structures according to some embodiments.
Figure 7:
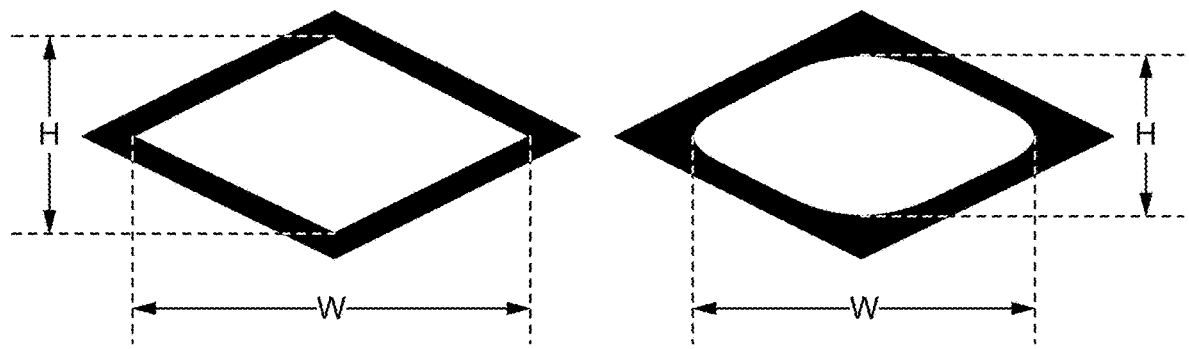
FIG. 7 illustrates a comparison between a cross-hatch pattern having sharp angled corners and a cross-hatch pattern having rounded corners.

FIG. 6 illustrates a top down view of a cross-hatch patterned return plane used in the circuit board transmission line structures according to some embodiments. The cross-hatch patterned return plane 20 includes regions 22 where conductive material is present and regions 24 where conductive material is not present. The shape of conductive regions 22 forms the cross-hatch pattern which include cross-hatch intersections 21. A distance between adjacent cross-hatch intersections in a same row is a cross-hatch width W, and a distance between adjacent cross-hatch intersections in a same column is a cross-hatch height H. The inner corners of each cross-hatch can form sharp angles, such as shown in FIG. 6 and in greater detail in the left hand side of FIG. 7, or the corners can be curved, as shown in the right hand side of FIG. 7. Rounding the inner corners effectively reduces the cross-hatch width W and the cross-hatch height H.

Figure 8:
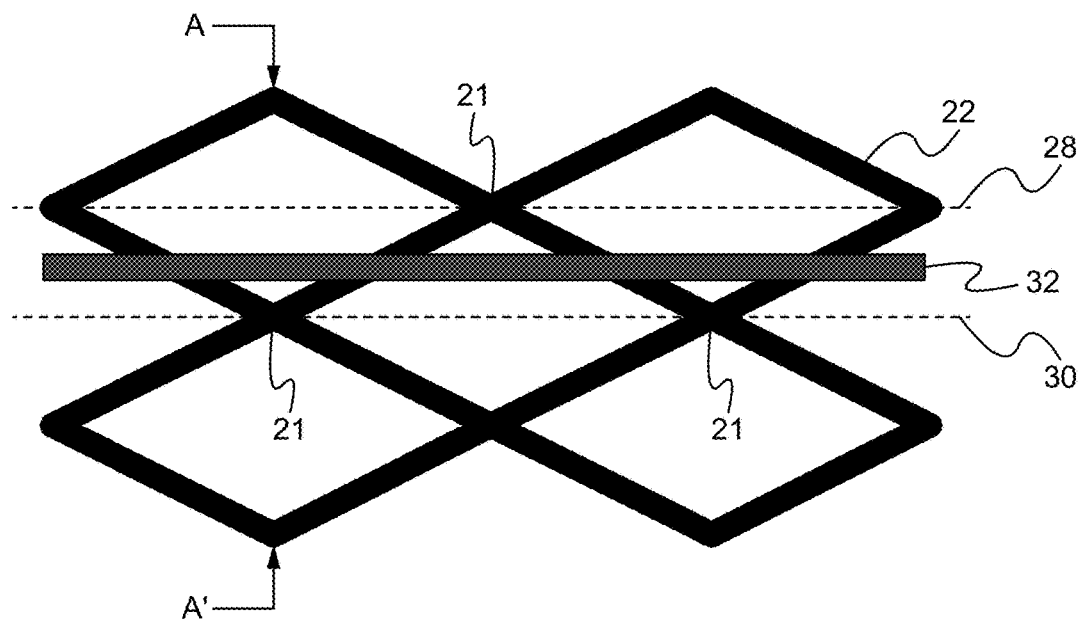
FIG. 8 illustrates a top down view of a circuit board transmission line structure having a single ended transmission line geometry according to some embodiments.
Figure 9:
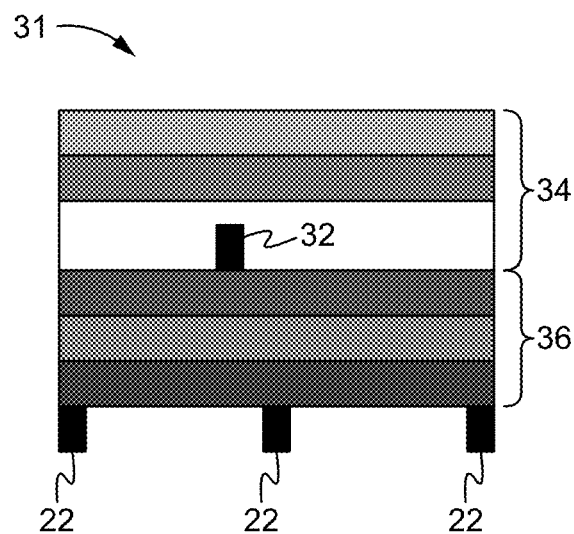
FIG. 9 illustrates a cut out side view of a circuit board having a single ended microstrip geometry according to some embodiments.

Circuit board transmission line structures can be configured to have microstrip or stripline transmission line geometries and cross-hatch patterned return planes. The cross-hatch design structure of the return planes and the relative position of the cross-hatch pattern to the transmission lines are configured to increase the usable bandwidth of the transmission lines. FIG. 8 illustrates a top down view of a circuit board transmission line structure having a single ended transmission line geometry according to some embodiments. Only the cross-hatch patterned return plane 22 and the transmission line 32 of the circuit board transmission line structure are shown in FIG. 8. The cross-hatch patterned return plane 22 is aligned with the transmission line 32 such that the widths of the cross-hatch pattern are parallel to the transmission line 32. The cross-hatch patterned return plane 22 is also aligned with the transmission line 32 such that the transmission line 32 is aligned between adjacent cross-hatch intersections, for example between cross-hatch intersections row 28 and cross-hatch intersections row 30, without overlapping the cross-hatch intersections 21 along a vertical cross-section of the circuit board stack-up, such as shown in FIG. 9. In still other embodiments, the cross-hatch patterned return plane 22 is aligned with the transmission line 32 such that the transmission line 32 is centered between adjacent cross-hatch intersection rows 28 and 30, as shown in FIG. 8, without overlapping the cross-hatch intersections 21 along a vertical cross-section of the circuit board stack-up.

FIG. 9 illustrates a cut out side view of a circuit board having a single ended microstrip geometry according to some embodiments. The circuit board 31 of FIG. 9 includes the cross-hatch patterned return plane 22 and the transmission line 32 of FIG. 8, which are shown in FIG. 9 cut along the line A-A' in FIG. 8. The circuit board 31 includes one or more isolation layers 34, a signal trace, one or more isolation layers 36, and the cross-hatch patterned return plane 22. The signal trace forms the transmission line 32. The one or more isolation layers 34 and the one or more isolation layers 36 can be made of different non-conducting dielectric materials and thicknesses, which prevents the transmission line 32 from electrically shorting to the cross-hatch patterned return plane 22. The one or more isolation layers 34 are optional. The cross-hatch patterned return plane can be made of one or more conductive materials, including, but not limited to, copper, nickel, gold, and tin, or a mixture of conductive and non-conductive materials, such as conductive ink.

Figure 10:
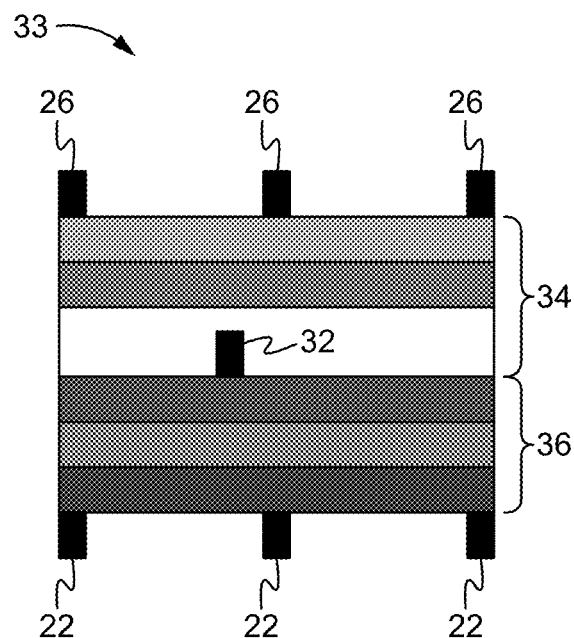
FIG. 10 illustrates a cut out side view of a circuit board having a having a single ended stripline geometry according to some embodiments.

FIG. 10 illustrates a cut out side view of a circuit board having a having a single ended stripline geometry according to some embodiments. The circuit board 33 of FIG. 10 includes the cross-hatch patterned return plane 22 and the transmission line 32 of FIG. 8, which are shown in FIG. 10 cut along the line A-A' in FIG. 8. The circuit board 33 having the single ended stripline geometry of FIG. 10 is structurally similar to the circuit board 31 having the single ended microstrip geometry of FIG. 9 except the circuit board 33 has an additional cross-hatch patterned return plane 26. The cross-hatch patterned return plane 26 is configured the same as and is aligned to the transmission line 32 the same as the cross-hatch patterned return plane 22.

Figure 11:
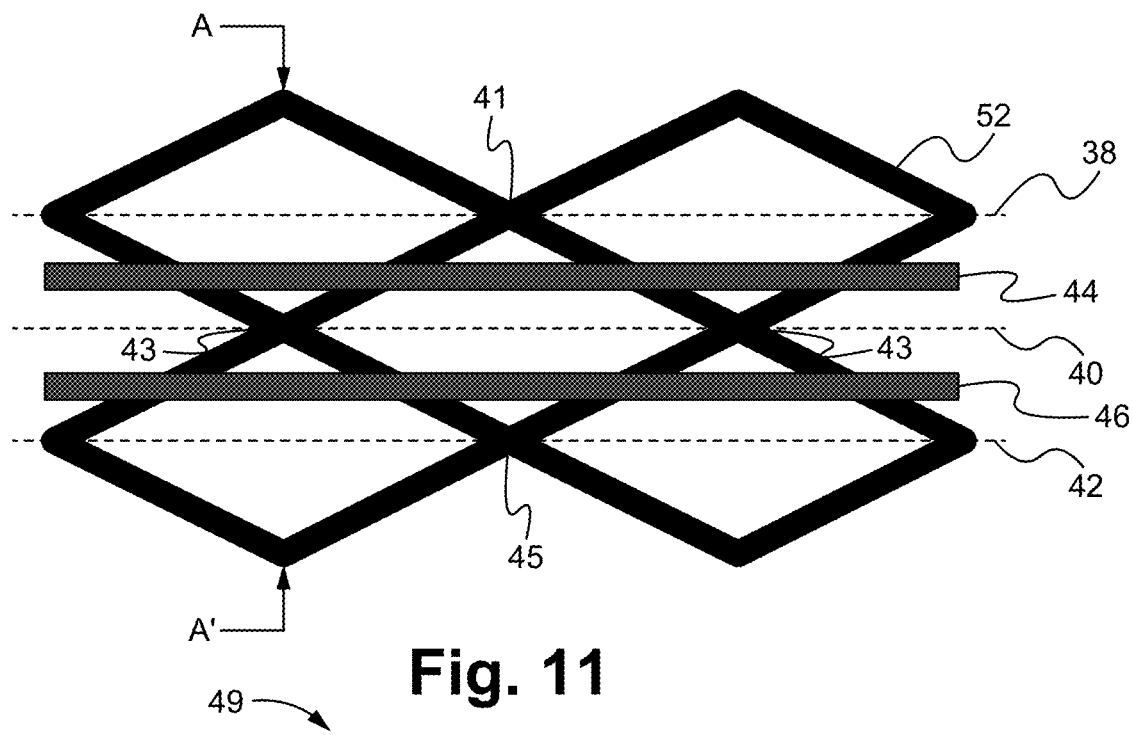
FIG. 11 illustrates a top down view of a circuit board transmission line structure having a differential pair transmission line geometry according to some embodiments.

FIG. 11 illustrates a top down view of a circuit board transmission line structure having a differential pair transmission line geometry according to some embodiments. Only a cross-hatch patterned return plane 52 and transmission lines 44 and 46 of the circuit board transmission line structure are shown in FIG. 11. The cross-hatch patterned return plane 52 is aligned with the transmission lines 44 and 46 such that the widths of the cross-hatch pattern are parallel to the transmission lines 44 and 46. The cross-hatch patterned return plane 52 is aligned with the transmission line 44 such that the transmission line 44 is aligned between adjacent cross-hatch intersections, for example between cross-hatch intersections row 38 and cross-hatch intersections row 40, without overlapping the cross-hatch intersections 41 and 43 along a vertical cross-section of the circuit board stack-up. In still other embodiments, the cross-hatch patterned return plane 52 is aligned with the transmission line 44 such that the transmission line 44 is centered between adjacent cross-hatch intersection rows 38 and 40, as shown in FIG. 11, without overlapping the cross-hatch intersections 41 and 43 along a vertical cross-section of the circuit board stack-up. Similarly, the cross-hatch patterned return plane 52 is aligned with the transmission line 46 such that the transmission line 46 is aligned between adjacent cross-hatch intersections, for example between cross-hatch intersections row 40 and cross-hatch intersections row 42, without overlapping the cross-hatch intersections 43 and 45 along a vertical cross-section of the circuit board stack-up. In still other embodiments, the cross-hatch patterned return plane 52 is aligned with the transmission line 46 such that the transmission line 46 is centered between adjacent cross-hatch intersection rows 40 and 42, as shown in FIG. 11, without overlapping the cross-hatch intersections 43 and 45 along a vertical cross-section of the circuit board stack-up. In this manner, the transmission lines 44 and 46 are considered to straddle the cross-hatch intersections 43 in the cross-hatch intersections row 40. In the differential pair configuration, the highest signal integrity is achieved when the two transmission lines straddle a series of cross-hatch intersections, such as cross-hatch intersections 43 in cross-hatch intersections row 40, and the transmission lines are each centered between adjacent cross-hatch intersections, such as transmission line 44 centered between cross-hatch intersections 41 in cross-hatch intersections row 38 and cross-hatch intersections 43 in cross-hatch intersections row 40, and transmission line 46 centered between cross-hatch intersections 43 in cross-hatch intersections row 40 and cross-hatch intersections 45 in cross-hatch intersections row 42.

Figure 12:
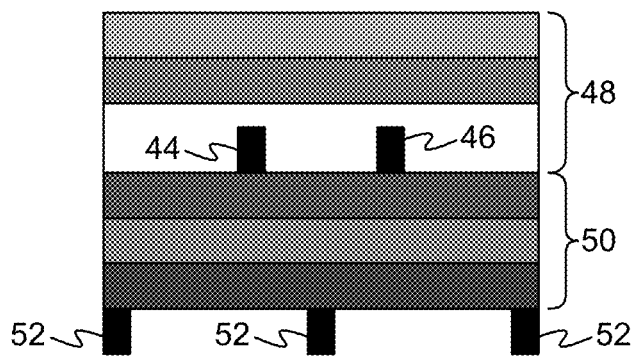
FIG. 12 illustrates a cut out side view of a circuit board having a differential pair microstrip geometry according to some embodiments.

FIG. 12 illustrates a cut out side view of a circuit board having a differential pair microstrip geometry according to some embodiments. The circuit board 49 of FIG. 12 includes the cross-hatch patterned return plane 52 and the transmission lines 44 and 46 of FIG. 11, which are shown in FIG. 12 cut along the line A-A' in FIG. 11. The circuit board 49 includes one or more isolation layers 48, two signal traces, one or more isolation layers 50, and the cross-hatch patterned return plane 52. The two signal traces form the differential pair transmission lines 44 and 46. The one or more isolation layers 48 and the one or more isolation layers 50 can be made of different non-conducting dielectric materials and thicknesses, which prevents the transmission lines 44 and 46 from electrically shorting to the cross-hatch patterned return plane 52. The one or more isolation layers 50 are optional.

Figure 13:
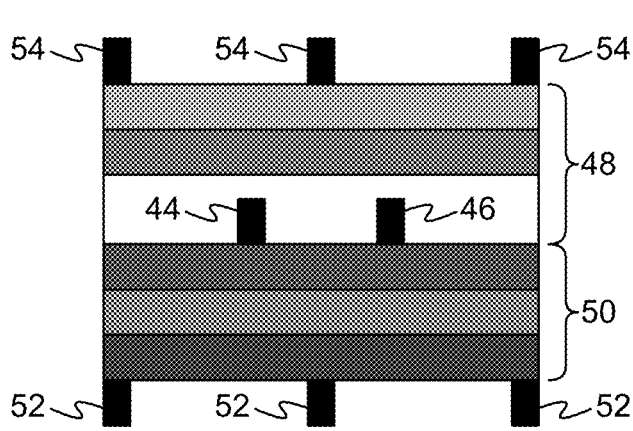
FIG. 13 illustrates a cut out side view of a circuit board having a having a differential pair stripline geometry according to some embodiments.

FIG. 13 illustrates a cut out side view of a circuit board having a having a differential pair stripline geometry according to some embodiments. The circuit board 51 of FIG. 13 includes the cross-hatch patterned return plane 52 and the transmission lines 44 and 46 of FIG. 11, which are shown in FIG. 13 cut along the line A-A' in FIG. 11. The circuit board 51 having the differential pair stripline geometry of FIG. 13 is structurally similar to the circuit board 49 having the differential pair microstrip geometry of FIG. 12 except the circuit board 51 has an additional cross-hatch patterned return plane 54. The cross-hatch patterned return plane 54 is configured the same as and is aligned to the transmission lines 44 and 46 the same as the cross-hatch patterned return plane 52.

Figure 14:
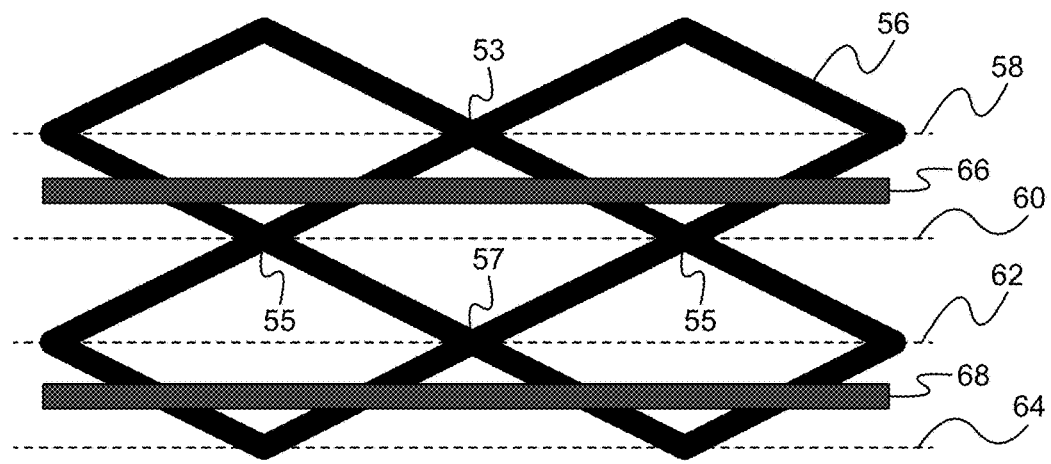
FIG. 14 illustrates a top down view of a circuit board transmission line structure having a single ended transmission line geometry according to some embodiments.
Figure 15:
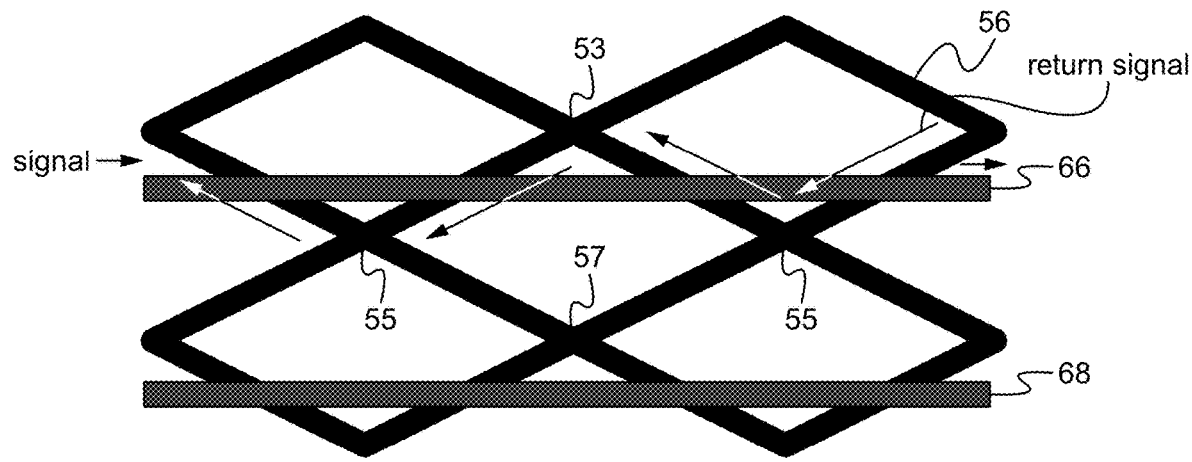
FIG. 15 illustrates signal and return signal for the single ended transmission line structure of FIG. 14.

In many applications, a circuit board includes multiple single ended transmission lines or multiple differential pairs of transmission lines. FIG. 14 illustrates a top down view of a circuit board transmission line structure having a single ended transmission line geometry according to some embodiments. In the exemplary circuit board of FIG. 14, there are two separate single ended transmission lines. In the case of multiple single ended transmission lines, such as shown in FIG. 14, each single ended transmission line is separated from an adjacent single ended transmission line by two or more rows of cross-hatch intersections, for example cross-hatch intersections 55 in cross-hatch intersections row 60 and a second row of cross-hatch intersections 57 in cross-hatch intersections row 62, so as to reduce crosstalk. A cross-hatch intersection functions as a reflection point for signals traveling along the return plane. For example, a return signal (left facing arrows in FIG. 15) corresponding to a signal (right facing arrows in FIG. 15) traveling along the single ended transmission line 66 travels along the cross-hatch return plane 56, as shown in FIG. 15, where the return signal bounces back and forth between adjacent cross-hatch intersections 55 (in cross-hatch intersections row 60) and cross-hatch intersections 53 (in cross-hatch intersections row 58), thereby crossing back and forth over the single ended transmission line 66. Although most of the return signal is reflected at each cross-hatch intersection, there is some portion of leakage signal that is not reflected. When intersecting a cross-hatch intersection 55, for example, this leakage signal continues toward the adjacent single ended transmission line 68 located between cross-hatched intersection rows 62 and 64 in FIG. 14. The additional row of cross-hatch intersections 57 function to reflect such leakage signals away from the single ended transmission line 68, thereby reducing cross-talk between the return signal corresponding to the single ended transmission line 66 and the signals associated with the single ended transmission line 68. Additional rows of cross-hatch intersections between adjacent single ended transmission lines serve to further reduce cross-talk. FIG. 14 shows a circuit board having two single ended transmission lines. It is understood that a circuit board can be configured with more than two single ended transmission lines.

Figure 16:
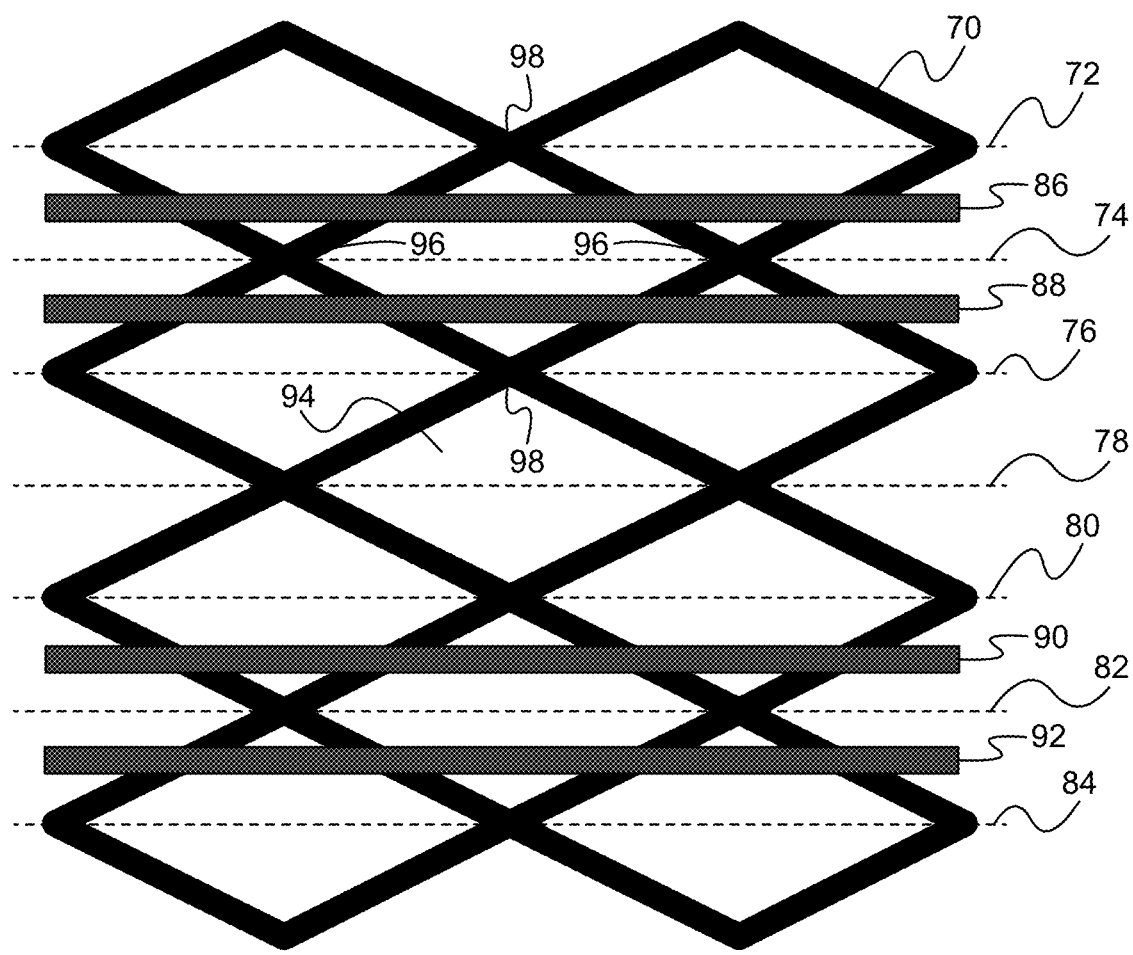
FIG. 16 illustrates a top down view of a circuit board transmission line structure having a differential pair transmission line geometry according to some embodiments.

Similar consideration for cross-talk can be applied to circuit boards having multiple differential pairs of transmission lines. FIG. 16 illustrates a top down view of a circuit board transmission line structure having a differential pair transmission line geometry according to some embodiments. In the exemplary circuit board of FIG. 16, there are two separate differential pairs of transmission lines, differential pair transmission lines 86, 88 and differential pair transmission lines 90, 92, selectively positioned relative to cross-hatch patterned return line 70 having cross-hatch intersections rows 72, 74, 76, 78, 80, 82, and 84. Exemplary cross-hatch intersections are shown at 96 and 98. In the case of multiple differential pair transmission lines, such as shown in FIG. 16, each differential pair transmission lines is separated from an adjacent differential pair transmission lines by one or more empty cross-hatch regions, such as empty region 94. An empty region separation corresponds to three rows of cross-hatch intersections, for example cross-hatch intersections rows 76, 78, 80. FIG. 16 shows two differential pairs of transmission lines. It is understood that a circuit board can be configured with more than two differential pairs of transmission lines.

The present application has been described in terms of specific embodiments incorporating details to facilitate the understanding of the principles of construction and operation of the circuit board transmission line structures. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A circuit board transmission line structure comprising:
   a. a stack of one or more insulating layers;
   b. a transmission line stacked on a first surface of the stack of one or more insulating layers; and
   c. a cross-hatch patterned return plane stacked on a second surface of the stack of one or more insulating layers, wherein the cross-hatch patterned return plane includes a mesh of interconnected conductor lines that form a plurality of cross-hatch intersections and a plurality of cross-hatch regions that lack conductive material, each cross-hatch region is bounded by a respective perimeter of conductive material formed by a subset of the plurality of cross-hatch intersections and corresponding conductor lines that interconnect the subset of plurality of cross-hatch intersections, wherein each cross-hatch region includes a respective cross-hatch region width and a respective cross-hatch region height, the respective cross-hatch region width is defined as a first distance between a first pair of the subset of cross-hatch intersections included in the respective perimeter of the respective cross-hatch region, the first pair of cross-hatch intersections are not directly connected by one of the corresponding conductor lines, and the respective cross-hatch region height is defined as a second distance between a second pair of the subset of cross-hatch intersections included in the respective perimeter of the respective cross-hatch region, the second pair of cross-hatch intersections are not directly connected by one of the corresponding conductor lines, further wherein the respective cross-hatch region width is greater than the respective cross-hatch region height, and the cross-hatch patterned return plane and the transmission line are aligned such that the transmission line is vertically aligned between the plurality of cross-hatch intersections without overlapping any of the plurality of cross-hatch intersections, and the transmission line is oriented at an angle non-parallel and non-perpendicular to any of the interconnected conductor lines in the mesh.

2. The circuit board transmission line structure of claim 1 wherein the cross-hatch intersections are arranged in rows and columns within the cross-hatch patterned return plane.

3. The circuit board transmission line structure of claim 2 wherein the cross-hatch intersections of each row are offset column-wise relative to the cross-hatch intersections of each adjacent row.

4. The circuit board transmission line structure of claim 2 wherein the transmission line is vertically positioned between the cross-hatch intersections of a first row and the cross-hatch intersections of a second row adjacent to the first row.

5. The circuit board transmission line structure of claim 4 wherein the transmission line is centered between the cross-hatch intersections of the first row and the cross-hatch intersections of the second row.

6. The circuit board transmission line structure of claim 1 further comprising one or more additional insulating layers and a second cross-hatch patterned return plane, wherein the one or more additional insulating layers are stacked on the transmission line such that the transmission line is stacked between the one or more insulating layers and the one or more additional insulating layers, further wherein the second cross-hatch patterned return plane is stacked on a surface of the one or more additional insulating layers such that the transmission line is positioned between the cross-hatch patterned return plane and the second cross-hatch patterned return plane.

7. The circuit board transmission line structure of claim 6 wherein the second cross-hatch patterned return plane includes a plurality of second cross-hatch intersections, and the second cross-hatch patterned return plane and the transmission line are aligned such that the transmission line is vertically aligned between the plurality of second cross-hatch intersections without overlapping any of the plurality of second cross-hatch intersections.

8. The circuit board transmission line structure of claim 7 wherein the cross-hatch patterned return plane and the second cross-hatch patterned return plane each have a same cross-hatch pattern, and the cross-hatch patterned return plane and the second cross-hatch patterned return plane are aligned such that the cross-hatch patterns of each completely overlap.

9. The circuit board transmission line structure of claim 6 wherein the transmission line, the cross-hatch patterned return plane, and the second cross-hatch patterned return plane form a single ended stripline geometry.

10. The circuit board transmission line structure of claim 1 wherein the respective perimeter of each cross-hatch region forms a quadrilateral with four cross-hatch intersections forming corners of the quadrilateral, further wherein the first pair of the subset of cross-hatch intersections included in the respective perimeter are two opposing corners of the quadrilateral and the second pair of the subset of cross-hatch intersections included in the respective perimeter are another two opposing corners of the quadrilateral.

11. The circuit board transmission line structure of claim 1 wherein the cross-hatch patterned return plane is aligned with the transmission line such that the respectively cross-hatch region width is parallel to the transmission line.

12. The circuit board transmission line structure of claim 1 wherein the transmission line and the cross-hatch patterned return plane form a single ended microstrip geometry.

13. The circuit board transmission line structure of claim 12 further comprising a second transmission line stacked on the first surface of the stack of one or more insulating layers, wherein the cross-hatch patterned return plane and the second transmission line are aligned such that the second transmission line is vertically aligned between the plurality of cross-hatch intersections without overlapping any of the plurality of cross-hatch intersections.

14. The circuit board transmission line structure of claim 13 wherein the cross-hatch intersections are arranged in rows, and the transmission line is vertically positioned between the cross-hatch intersections of a first row and the cross-hatch intersections of a second row adjacent to the first row, and the second transmission line is vertically positioned between the cross-hatch intersections of a third row and the cross-hatch intersections of a fourth row adjacent to the third row, wherein the transmission line is spaced apart from the second transmission line by at least two adjacent rows of cross-hatch intersections in the cross-hatch patterned return plane.

15. The circuit board transmission line structure of claim 14 wherein the transmission line is centered between the cross-hatch intersections of the first row and the cross-hatch intersections of the second row, and the second transmission line is centered between the cross-hatch intersections of the third row and the cross-hatch intersections of the fourth row.

16. A circuit board transmission line structure comprising:
   a. a stack of one or more insulating layers;
   b. a pair of transmission lines forming a differential pair, the pair of transmission lines stacked on a first surface of the stack of one or more insulating layers; and
   c. a cross-hatch patterned return plane stacked on a second surface of the stack of one or more insulating layers, wherein the cross-hatch patterned return plane includes a mesh of interconnected conductor lines that form a plurality of cross-hatch intersections and a plurality of cross-hatch regions that lack conductive material, each cross-hatch region is bounded by a respective perimeter of conductive material formed by a subset of the plurality of cross-hatch intersections and corresponding conductor lines that interconnect the subset of plurality of cross-hatch intersections, wherein each cross-hatch region includes a respective cross-hatch region width and a respective cross-hatch region height, the respective cross-hatch region width is defined as a first distance between a first pair of the subset of cross-hatch intersections included in the respective perimeter of the respective cross-hatch region, the first pair of cross-hatch intersections are not directly connected by one of the corresponding conductor lines, and the respective cross-hatch region height is defined as a second distance between a second pair of the subset of cross-hatch intersections included in the respective perimeter of the respective cross-hatch region, the second pair of cross-hatch intersections are not directly connected by one of the corresponding conductor lines, further wherein the respective cross-hatch region width is greater than the respective cross-hatch region height, and the cross-hatch patterned return plane and the pair of transmission lines are aligned such that the pair of transmission lines are each vertically aligned between the plurality of cross-hatch intersections without overlapping any of the plurality of cross-hatch intersections, and the pair of transmission lines are each oriented at an angle non-parallel and non-perpendicular to any of the interconnected conductor lines in the mesh.

17. The circuit board transmission line structure of claim 16 wherein the cross-hatch intersections are arranged in rows and columns within the cross-hatch patterned return plane.

18. The circuit board transmission line structure of claim 17 wherein the cross-hatch intersections of each row are offset column-wise relative to the cross-hatch intersections of each adjacent row.

19. The circuit board transmission line structure of claim 17 wherein a first transmission line of the differential pair is vertically positioned between the cross-hatch intersections of a first row and the cross-hatch intersections of a second row adjacent to the first row, and a second transmission line of the differential pair is vertically positioned between the cross-hatch intersections of the second row and the cross-hatch intersections of a third row adjacent to the second row.

20. The circuit board transmission line structure of claim 19 wherein the first transmission line is centered between the cross-hatch intersections of the first row and the cross-hatch intersections of the second row, and the second transmission line is centered between the cross-hatch intersections of the second row and the cross-hatch intersections of the third row.

21. The circuit board transmission line structure of claim 16 further comprising one or more additional insulating layers and a second cross-hatch patterned return plane, wherein the one or more additional insulating layers are stacked on the pair of transmission lines such that the pair of transmission lines are stacked between the one or more insulating layers and the one or more additional insulating layers, further wherein the second cross-hatch patterned return plane is stacked on a surface of the one or more additional insulating layers such that the pair of transmission lines are positioned between the cross-hatch patterned return plane and the second cross-hatch patterned return plane.

22. The circuit board transmission line structure of claim 21 wherein the second cross-hatch patterned return plane includes a plurality of second cross-hatch intersections, and the second cross-hatch patterned return plane and the pair of transmission lines are aligned such that the pair of transmission lines are vertically aligned between the plurality of second cross-hatch intersections without overlapping any of the plurality of second cross-hatch intersections.

23. The circuit board transmission line structure of claim 22 wherein the cross-hatch patterned return plane and the second cross-hatch patterned return plane each have a same cross-hatch pattern, and the cross-hatch patterned return plane and the second cross-hatch patterned return plane are aligned such that the cross-hatch patterns of each completely overlap.

24. The circuit board transmission line structure of claim 22 wherein the pair of transmission lines, the cross-hatch patterned return plane, and the second cross-hatch patterned return plane form a differential pair stripline geometry.

25. The circuit board transmission line structure of claim 16 wherein the respective perimeter of each cross-hatch region forms a quadrilateral with four cross-hatch intersections forming corners of the quadrilateral, further wherein the first pair of the subset of cross-hatch intersections included in the respective perimeter are two opposing corners of the quadrilateral and the second pair of the subset of cross-hatch intersections included in the respective perimeter are another two opposing corners of the quadrilateral.

26. The circuit board transmission line structure of claim 16 wherein the cross-hatch patterned return plane is aligned with the pair of transmission lines such that the respective cross-hatch region width is parallel to the pair of transmission lines.

27. The circuit board transmission line structure of claim 16 wherein the pair of transmission lines and the cross-hatch patterned return plane form a differential pair microstrip geometry.

28. The circuit board transmission line structure of claim 27 further comprising a second pair of transmission lines stacked on the first surface of the stack of one or more insulating layers, wherein the cross-hatch patterned return plane and the second pair of transmission lines are aligned such that the second pair of transmission lines are each vertically aligned between the plurality of cross-hatch intersections without overlapping any of the plurality of cross-hatch intersections.

29. The circuit board transmission line structure of claim 28 wherein the cross-hatch intersections are arranged in rows and columns within the cross-hatch patterned return plane, and a first transmission line of the pair of transmission lines is vertically positioned between the cross-hatch intersections of a first row and the cross-hatch intersections of a second row adjacent to the first row, a second transmission line of the pair of transmission lines is vertically positioned between the cross-hatch intersections of the second row and the cross-hatch intersections of a third row adjacent to the second row, a first transmission line of the second pair of transmission lines is vertically positioned between the cross-hatch intersections of a fourth row and the cross-hatch intersections of a fifth row adjacent to the fourth row, a second transmission line of the second pair of transmission lines is vertically positioned between the cross-hatch intersections of the fifth row and the cross-hatch intersections of a sixth row adjacent to the fifth row, wherein the second transmission line of the pair of transmission lines is spaced apart from the first transmission line of the second pair of transmission lines by at least three adjacent rows of cross-hatch interconnects in the cross-hatch patterned return plane.

30. The circuit board transmission line structure of claim 29 wherein the first transmission line of the pair of transmission lines is centered between the cross-hatch intersections of the first row and the cross-hatch intersections of the second row, the second transmission line of the pair of transmission lines is centered between the cross-hatch intersections of the second row and the cross-hatch intersections of the third row, the first transmission line of the second pair of transmission lines is centered between the cross-hatch intersections of the fourth row and the cross-hatch intersections of the fifth row, and the second transmission line of the second pair of transmission lines is centered between the cross-hatch intersections of the fifth row and the cross-hatch intersections of the sixth row.

\* \* \* \* \*